United States Patent [19]
Takahashi et al.

[11] Patent Number: 5,642,040
[45] Date of Patent: Jun. 24, 1997

[54] ELECTROOPTIC PROBE FOR MEASURING VOLTAGE OF AN OBJECT HAVING A HIGH PERMITTIVITY FILM FIXED ON AN END FACE OF A REFLECTING FILM FIXED ON AN ELECTROOPTIC MATERIAL

[75] Inventors: Hironori Takahashi; Kazuhiko Wakamori, both of Hamamatsu, Japan

[73] Assignee: Hamamatsu Photonics K.K., Hamamatsu, Japan

[21] Appl. No.: 547,449

[22] Filed: Oct. 24, 1995

Related U.S. Application Data

[63] Continuation of Ser. No. 213,011, Mar. 14, 1994, abandoned.

[30] Foreign Application Priority Data

Mar. 15, 1993 [JP] Japan ..................................... 5-054221

[51] Int. Cl.$^6$ ..................................... G01R 23/16
[52] U.S. Cl. ..................................... 324/96; 324/750
[58] Field of Search ..................................... 324/96, 117 R, 324/244.1, 753, 752, 158.1; 359/315, 318, 322, 245, 263; 250/231.1

[56] References Cited

U.S. PATENT DOCUMENTS

| | | | |
|---|---|---|---|
| 4,446,425 | 5/1984 | Valdmanis et al. | 324/76.36 |
| 4,631,402 | 12/1986 | Nagatsuma et al. | 250/231.1 |
| 4,920,310 | 4/1990 | Aoshima et al. | 324/96 |
| 4,982,151 | 1/1991 | Takahashi et al. | 324/96 |
| 5,055,770 | 10/1991 | Takahashi et al. | 324/96 |
| 5,500,587 | 3/1996 | Takahashi | 324/753 |

FOREIGN PATENT DOCUMENTS

| | | |
|---|---|---|
| 0294815 | 12/1988 | European Pat. Off. . |
| 0293841 | 12/1988 | European Pat. Off. . |
| 0392830 | 10/1990 | European Pat. Off. . |
| 0528465 | 2/1993 | European Pat. Off. . |
| 63-308572 | 12/1988 | Japan . |
| 03156379 | 7/1991 | Japan . |

OTHER PUBLICATIONS

IEEE Journal of Quantum Electronics, vol, QE-22, No. 1, Jan. 1986, "Subpicosecond Electrooptic Sampling: Principles and Applications", pp. 69-78.

IEEE Jurnal of Quantum Electronics, vol. WE-22, No. 1, Jan. 1986, "Electrooptic Sampling in GaAs Integrated Circuits", pp. 79-93.

J. Appl. Phys. 66(9), 1 Nov. 1989, "Subpicosecond Sampling Using a Noncontact Electro-Optic Probe", pp. 4001-4009.

Aoshima et al, "Non-Contact Picosecond Electro-Optic Sampling Utilizing Semiconductor Laser Pulses", SPIE Ultra High Speed and High Speed Photography, Photonics and Videography '89, vol. 1155, pp. 494-510, 1989 (no month available).

Patent Abstracts Of Japan, vol. 17, No. 231 (P-1532) May 11, 1993 & JP-A-04 359 162 (Fujitsu) Dec. 11, 1992.

*Primary Examiner*—Vinh P. Nguyen
*Attorney, Agent, or Firm*—Cushman Darby & Cushman, IP Group of Pillsbury Madison & Sutro, LLP

[57] ABSTRACT

An electrooptic probe for measuring voltage of an object without contact with the object. The electrooptic probe according to the present invention includes an electro-optic material having a refractive index to light that varies in accordance with an electric field, a conductive reflecting film for reflecting an incident beam transmitted through the electro-optic material, fixed to an end face of the electro-optic material facing the object to be measured, a transparent electrode fixed on the other end face of the electro-optic material, and a high permittivity film fixed on an end face of the reflecting film facing the object to be measured.

30 Claims, 7 Drawing Sheets

ELECTROOPTIC PROBE FOR MEASURING VOLTAGE OF AN OBJECT HAVING A HIGH PERMITTIVITY FILM FIXED ON AN END FACE OF A REFLECTING FILM FIXED ON AN ELECTROOPTIC MATERIAL

This is a continuation of application Ser. No. 08/213,011, filed on Mar. 14, 1994, which was abandoned upon the filing hereof.

BACKGROUND OF THE INVENTION

1. Field of the Invention

The present invention relates to an electrooptic probe (E-O probe) which is applied to a voltage measurement apparatus which measures the voltage of an object without contact by detecting electric field strength generated by the object.

2. Related Background Art

Techniques disclosed in "Japanese Patent Laid-Open No. 63-308572" have been known in the above-described field. In this reference, an E-O probe in which a metal reflecting film is formed on a measuring surface of an electro-optic material of which the refractive index is varied by a change of the electric field is disclosed.

Referring to FIG. 1 and FIG. 2, the measurement of the electric field strength by such an E-O probe will be explained. FIG. 1 and FIG. 2 show a perspective view and a side view, respectively. As shown in these drawings, the conventional E-O probe 100 comprises an electro-optic material 101, a reflecting film 102 which is a thin metal film fixed to an end face of the electro-optic material 101 facing to an electrode to be measured 110, and a transparent electrode 103 fixed to the other end face of the electro-optic material 101. The transparent electrode 103 is set at ground voltage level, or at a fixed voltage level. In a case of a thin electro-optic material 101, the E-O probe is used with the upper part of the transparent electrode 103 fixed by a transparent support 104.

In the conventional E-O probe, there were problems that the voltage of the electrode to be measured could not be measured at high sensitivity and that since the cut-off frequency $f_T$ against the voltage signal was comparatively high, the voltage signal at low frequency could not be measured.

SUMMARY OF THE INVENTION

An electrooptic probe according to the present invention comprises an electro-optic material having refractive index to light that varies in accordance with an electric field, a conductive reflecting film for reflecting an incident light beam transmitted through the electro-optic material, fixed to an end face of the electro-optic material facing to the object to be measured, a transparent electrode fixed on the other end face of the electro-optic material, and a high permittivity film fixed on an end face of the reflecting film facing the object to be measured.

According to the E-O probe of the present invention, if the thickness of the high permittivity film fixed to the metal reflecting film is thin, the metal reflecting film and the object to be measured are sufficiently close to each other, whereby the capacitance of the high permittivity film increases. Therefore, the relative ratio of the capacitance of the high permittivity film to the capacitance of the electro-optic material increases. Accordingly, the voltage applied to the electro-optic material increases, and the detecting sensitivity of the electro-optic material to the voltage of the object is improved.

Further, as the capacitance of the high permittivity film increases, the cut-off frequency $f_T$ decreases. This is because the capacitance $C_3$ of the high permittivity film is a denominator of the following equation of cut-off frequency $f_T$.

$$f_T = 1/(2\pi(C_1+C_3)R_1)$$

where $C_1$=capacitance of electro-optic material $R_1$=resistance of electro-optic material As described above, if the cut-off frequency $f_T$ is small, the low frequency signal, which could not conventionally be detected, can be detected, whereby the detecting sensitivity in the low frequency range is improved.

Further, if a resilient material which is elastic such as a rubber is used as the high permittivity film, damage to the object to be measured when the E-O probe comes into contact therewith can be reduced.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 1 is a perspective view thereof and FIG. 2 is a side view thereof.

FIG. 3 is for a case of infinite resistivity and FIG. 4 is for a case of a finite value of resistivity.

FIG. 7 is for a case of infinite resistivity and FIG. 8 is for a case of a finite value of resistivity.

FIG. 10 is for a case of using polymeric material 14 and FIG. 11 is for a case of sealing liquid 14b of the high relative permittivity in a capsule.

DETAILED DESCRIPTION OF THE PREFERRED EMBODIMENTS

Figure 1:
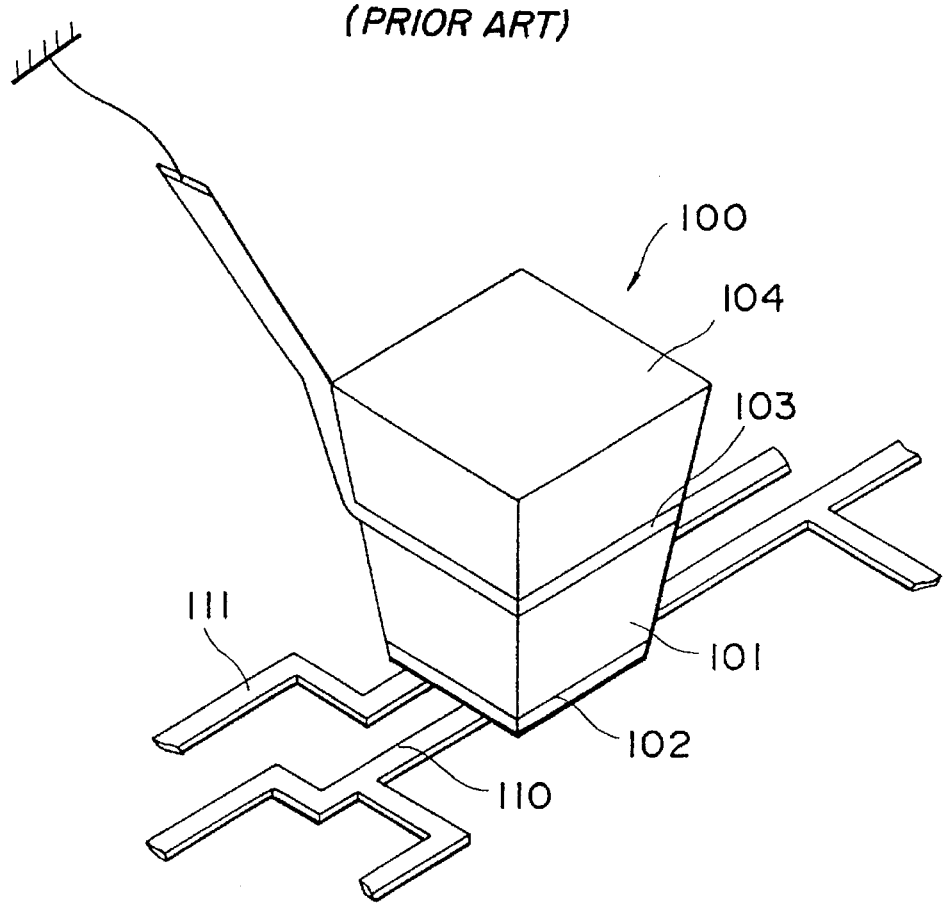
FIG. 1 and FIG. 2 show the measurement of the voltage $V_{in}$ of an electrode to be measured 110 by a conventional E-O probe 100.
Figure 2:
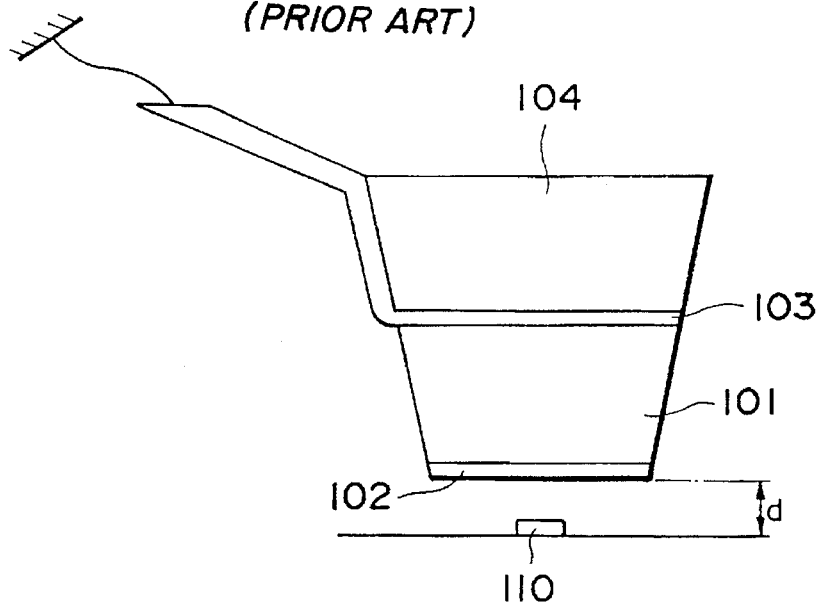
Figure 3:
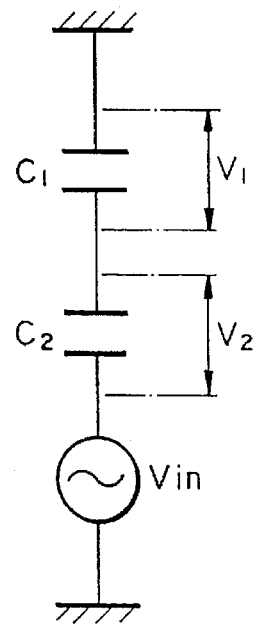
FIG. 3 and FIG. 4 are a circuit diagram showing an equivalent circuit of a conventional E-O probe 100.

To measure electric field strength of an electrode 110 by a conventional E-O probe 100, a method in which the electrode 110 is measured without contact as shown in FIG. 2 is generally applied. This is because there exists a conductive reflecting film 102 on a base of the E-O probe 100. In this measurement, as shown in FIG. 3, the applied voltage $V_{in}$ is divided into $V_1$ and $V_2$ and applied to a capacitance $C_1$ of an electro-optical material 101 (specifically, the capacitance of the parallel plates made by assuming two electrodes are on an upper and bottom surfaces of the electro-optical material 101) and a capacitance $C_2$ in air of a space d between the reflecting film 102 and the electrode 110 to be measured, respectively. Here, in order to measure at high sensitivity, the voltage $V_1$ applied to the electro-optic material 101 is required to be large. The relative ratio of the capacitance $C_2$ in air to the capacitance $C_1$ of the electro-optic material 101 should increase therefor.

However, in practice, it was hard to increase the relative ratio of the capacitance $C_2$ in air to the capacitance $C_1$.

For example, in a case of using ZnTe having the 10.4 relative permittivity and the 200 μm×200 μm×10 μm crystal size as the electro-optic material 101, the capacitance $C_1$ is given by $$C_1 = (10.4 \times 8.854 \times 10^{-12}) \times (200 \times 10^{-6})^2/(10 \times 10^{-6})$$
$$= 3.68 \times 10^{-13} \ (F).$$

On the other hand, in a case of a 1 μm space d between the reflecting film 102 and the electrode 110, the capacitance $C_2$ in air (the relative permittivity is 1.0) is given by $$C_2 = (1.0 \times 8.854 \times 10^{-12}) \times (200 \times 10^{-6})^2/(1 \times 10^{-6})$$
$$= 3.54 \times 10^{-13} \ (F).$$

Further, in a case of a 10 μm space d between the reflecting film 102 and the electrode 110, the capacitance $C_2$ (the relative permittivity is 1.0) is given by $$C_2 = (1.0 \times 8.854 \times 10^{-12}) \times (200 \times 10^{-6})^2/(10 \times 10^{-6})$$
$$= 3.54 \times 10^{-14} \ (F).$$

In the case of the 1 μm space d between the reflecting film 102 and the electrode 110, since the capacitance $C_1$ is nearly equal to the capacitance $C_2$, $V_1$ is also nearly equal to $V_2$. In this case, only about 50% of the applied voltage is applied to the electro-optic material 101, which lowers the detecting sensitivity.

In the case of the 10 μm space d between the reflecting film 102 and the electrode 110, since the ratio of the capacitance $C_1$ to the capacitance $C_2$ is approximately 10 to 1, the ratio of $V_1$ to $V_2$ is 1 to 10. In this case, only about 9% of the applied voltage is applied to the electro-optic material 101, which further lowers the detecting sensitivity.

As described above, in the conventional E-O probe 100, since it is hard to increase the relative ratio of the capacitance $C_2$ in air to the capacitance $C_1$ of the electro-optic material 101, there is a problem that the detecting sensitivity is low.

Figure 4:
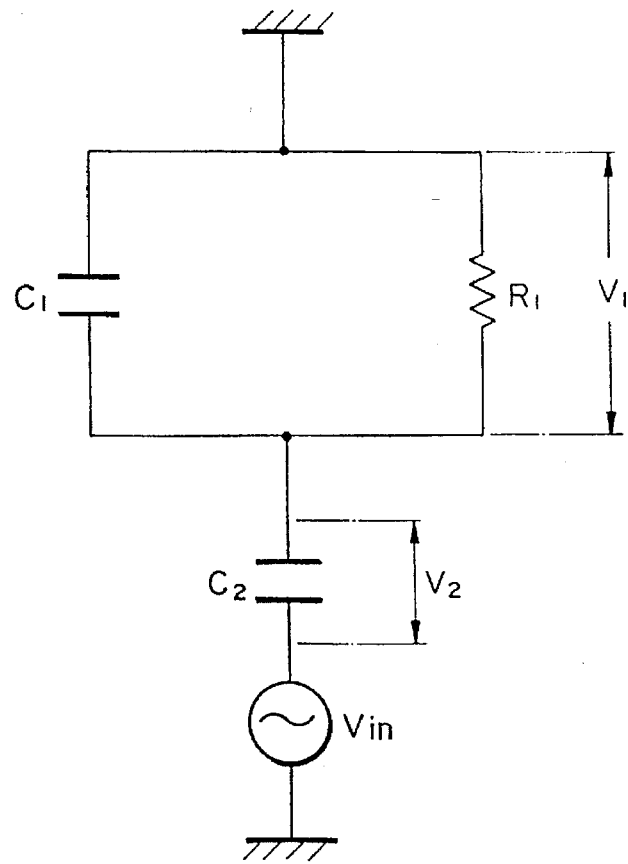

Further, in the case of the infinite resistivity of the electro-optic material 101, only the equivalent circuit shown in FIG. 3 is taken into consideration; however, in a case that impurities or defects exist in the electro-optic material 101, the resistivity ρ is lowered. Therefore an equivalent circuit with the resistance $R_1$ of the electro-optic material 101 as shown in FIG. 4 is needed to be taken into consideration.

In this equivalent circuit, a resistor $R_1$ and a capacitor $C_1$ are connected in parallel, which makes a low-frequency cut filter. Then, the cut-off frequency $f_T$ is given by $$f_T = 1/(2\pi(C_1+C_2)R_1).$$

For example, in a case of using ZnTe having the resistivity $\rho = 1 \times 10^6 \Omega cm$ and the same crystal size as above as the electro-optic material 101, $R_1$ is given by $$R_1 = (1 \times 10^3) \times (10 \times 10^{-6})/(200 \times 10^{-6})^2$$
$$= 2.5 \times 10^5 \ \Omega.$$

Then, cut-off frequency $f_T$ is given by $$f_T = 1/(2\pi(3.68 \times 10^{-13} + 3.54 \times 10^{-13}) \times 2.5 \times 10^5)$$
$$= 8.82 \times 10^5 \ Hz$$
$$= 882 \ KHz.$$

Accordingly, in the conventional E-O probe 100, there was a problem that a signal below 882 KHz could not be detected because it was below the cut-off frequency.

Degradation of the detecting sensitivity in the low frequency region was a big problem such that the right waveform could not be reproduced in a case of a real-time measuring method using a continuous wave (CW) laser beam source and a high-speed photodetector.

In a case of a sampling measuring method using a pulsed light source of which the frequency of repetition was lower than the frequency of the voltage $V_{in}$ to be measured, if the frequency of repetition of the pulse source was higher than the cut-off frequency, degradation of the detecting sensitivity in the low-frequency region was not a problem, since it is out of the frequency region which can be measured. However, in a case of the frequency of repetition of the pulse light source lower than the cut-off frequency, degradation of the detecting sensitivity was a problem similar to the real-time measuring method.

According to the present invention, a problem of a drop in detecting sensitivity due to the small capacitance $C_2$ in air, and a problem of a drop in detecting sensitivity in a frequency region lower than the cut-off frequency $f_T$ are solved, and then an E-O probe with high detecting sensitivity can be provided.

Figure 5:
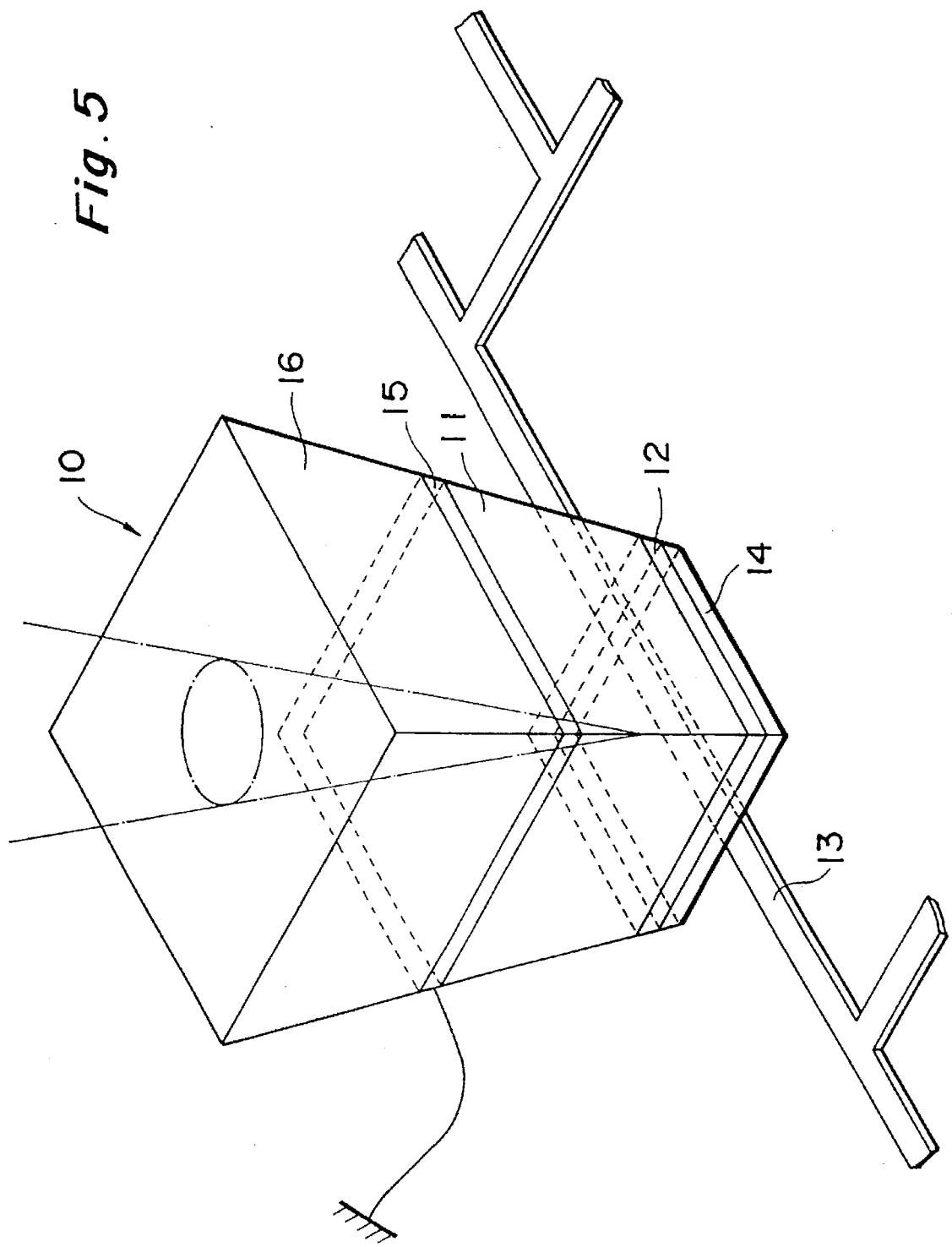
FIG. 5 is a perspective view showing structure of an E-O probe 10 according to the first embodiment of the present invention.

FIG. 5 is a perspective view showing the structure of an E-O probe 10 according to the first embodiment. An E-O probe 10 comprises a truncated-quadrangular-pyramidal electro-optic material 11 of which the refractive index is varied by a change of the electric field, a thin, flat metal reflecting film 12 fixed to an end face of the electro-optic material 11 facing to an electrode to be measured 13, an insulating high permittivity film 14 fixed to an end face of the metal reflecting film 12 facing the electrode to be measured 13, and a transparent electrode 15 fixed to the other end face of the electro-optic material 11. Further, in a case of thin electro-optic material 11, an upper surface of the transparent electrode 15 is fixed to a transparent support 16, whereby certain mechanical strength can be obtained.

LiTaO₃, GaAs, ZnTe, BSO, and CdTe are used as material of the electro-optic material 11.

Further, the metal reflecting film 12 is placed to reflect an incident beam transmitted through the electro-optic material 11, and Al (aluminum), Ag (silver), Au (gold), and Cu (cooper) are used as material of the metal reflecting film 12. The metal reflecting film 12 using Al has the high reflectance to visible light or ultra violet rays, and the metal reflecting film 12 using Ag, Au, or Cu has the high reflectance to infrared rays. Even though the thickness of the metal reflecting film 12 is as thin as 0.2 μm, light is hardly transmitted therethrough.

Figure 6:
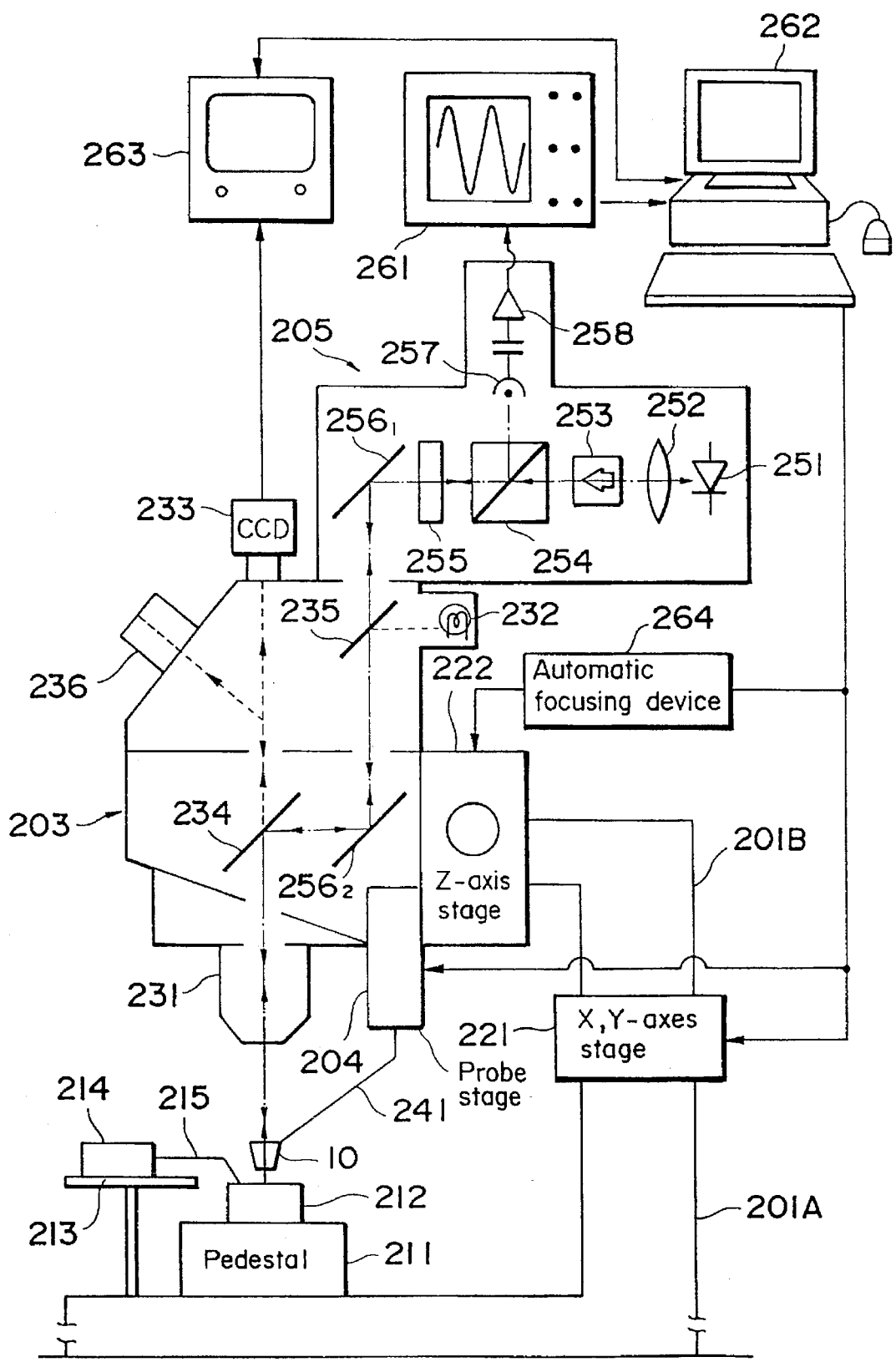
FIG. 6 is the whole structure of a system for the measurement of voltage to which an E-O probe 10 of the first embodiment is applied.

Next, referring to FIG. 6, the whole structure of a system for the measurement of voltage to which the E-O probe 10 of the first embodiment is applied will be explained. As shown in FIG. 6, a pedestal 211 is placed on an upper surface of a holddown body part 201A and a device 212 to be measured is set on the part 201A. Further, an operation table 213 is fixed on the holddown body part 201A nearby the pedestal 211, and a manipulator 214 is installed on the operation table 213. Then, an electrical pin 215 is placed on the manipulator 214, which provides a power supply or a signal input to the device 212.

An X–Y axes stage 221 is installed at a pillar part of the holddown body part 201A, and a moveable body part 201B is installed on the X–Y axes stage 221. And a Z-axis stage 222 is installed at the moveable body part 201B. Then, a microscope unit 203 is installed at the Z-axis stage 222, and a probe stage 204 is fixed at the microscope unit 203. A support pin 241 of tungsten extends from the probe stage 204, and the E-O probe 10 is supported by the end of the support pin 241.

The microscope unit 203 comprises an objective lens 231 which faces a surface of the device 212 through the E-O probe 10. Further, the microscope unit 203 comprises a lightening source 232 for lightening on the surface of the device 212, a CCD camera 233 for taking an image of the surface of the device 212, and an Eyepiece 236. Note that for the E-O probe 10 of a ZnTe crystal, a visible-ray camera is used as the CCD camera 233, and for a GaAs crystal, an infrared camera is used.

The microscope unit 203 comprises dichroic mirrors 234 and 235 which couple the above lighting source and the imaging system, and a laser optical system for the voltage measurement which will be described later. That is, the dichroic mirror 234 transmits 50% of light of the wavelength from the lighting source 232 and reflects light from a laser beam source (described later). Further, the dichroic mirror 235 reflects light of the wavelength from the lighting source 232, and transmits light of the wavelength from the laser beam source. As described above, the objective lens 231 is used for both lighting and taking the image of the device 212, and radiating laser beams for the voltage measurement.

A voltage measuring unit 205 which is operated by a laser beam is installed at the microscope unit 203. Light coming out from the CW laser diode 251 goes to an optical isolator 253 through the lens 252. The optical isolator 253 transmits light only in one direction, and the transmitted light passes through a polarization beam splitter 254 and a ½-wave plate 255, and its light path is changed by mirrors $256_1$ and $256_2$. Then, the light is reflected by the dichroic mirror 234, passes through the magnifying lens system 231, and goes to the E-O probe 10. The laser beams reflected by the bottom surface of the E-O probe 10 pass the magnifying lens system 231 again and ⅛-wave plate 255, then go into polarization beam splitter 254. At this point, because the laser beams pass the ⅛-wave plate 255 twice, it is shifted by a quarter-wave in phase, whereby the laser beams are circularly polarized. Accordingly, half of the incident laser beams to the polarization beam splitter 254 is reflected here and goes to the photodiode 257. Then, an output of the photodiode 257 is amplified by an amplifier 258 and is output to the outside.

Here, the principle of the measurement of the voltage $V_{in}$ will be briefly described. If the voltage $V_{in}$ is applied to an electrode (not shown) on the surface of the device 212, the refractive index of the E-O probe 10 neighboring the electrode is changed by an electro-optic effect. Then, the polarization condition of the laser beams are changed while travelling through the crystal back and forth. Therefore, the ratio of the laser beam reflected by the polarization beam splitter 254 and going to the photodiode 257 is changed, so that the voltage $V_{in}$ of the device 212 can be measured from the output of the photodiode 257.

The measurement results are displayed on a digital oscilloscope 261, and processed by a computer 262. Note that the monitoring image taken by a CCD camera 233 is displayed on a TV monitor 263. Here, the TV monitor 263 comprises memories for picture, so that the obtained image can be stored therein as a still picture (freezing image), and displayed thereon. Alternately, the monitoring image taken by the CCD camera 233 is entered and stored in the computer 262, and then displayed on a monitor of the computer 262, or on the TV monitor 263.

The computer 262 controls a Z-axis stage 222 by using an automatic focusing device 264, and further controls an X–Y axes stage 221 and a probe stage 204. The CCD camera 233 takes the image observed by the microscope system, and based on the results of the image processing obtained from the information such as contrast of the image, the automatic focusing device 264 adjusts the focus of the image by moving the microscope system up and down.

In the measurement using the E-O probe 10 according to the present embodiment, the measuring surface of the high permittivity film 14 comes in contact with the electrode 13, so that the metal reflecting film 12 and the electrode 13 can come sufficiently closer to each other without the metal reflecting film 12 coming in contact with the electrode 13. Therefore, the space d between the metal reflecting film 12 and the electrode 13 to be measured can be very narrow, and the capacitance of the high permittivity film 14 can be sufficiently be large.

For example, assuming that $TiO_2$ ($\epsilon_r=100$) is vapor-deposited to 0.2 μm thickness as the high relative permittivity film 14, the capacitance $C_3$ is given by $$C_3 = (100 \times 8.85 \times 10^{-12}) \times (200 \times 10^{-6})^2/(0.2 \times 10^{-6})$$
$$= 1.77 \times 10^{-10} \, (F),$$

which is a very large capacitance.

Figure 7:
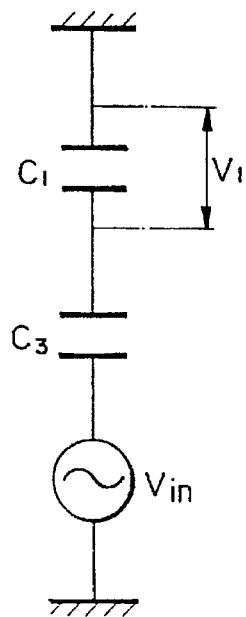
FIG. 7 and FIG. 8 are a circuit diagram showing an equivalent circuit of an E-O probe 10 according to the first embodiment of the present invention.

In the case that the resistivity of the electro-optic material 11 is assumed to be infinite, the equivalent circuit of the E-O probe 10 is the one shown in FIG. 7. In a case that as the electrooptic material 11, ZnTe having the 10.4 relative permittivity and the 200 μm ×200 μm×10 μm crystal size which is the same as described above is used, the capacitance $C_1$ is given by $$C_1 = (10.4 \times 8.854 \times 10^{-12}) \times (200 \times 10^{-6})^2/(10 \times 10^{-6})$$
$$= 3.68 \times 10^{-13} \, (F).$$

The ratio of $C_1$ to $C_3$ in this case is given by $$C_1:C_3 = 3.68 \times 10^{-13}(F) : 1.77 \times 10^{-10}(F) = 1:481,$$

so that almost all of the voltage $V_{in}$ is applied to the electro-optic material 11. Therefore, the detecting sensitivity of the electro-optic material 11 is improved.

In the case of FIG. 3 that the high permittivity film is not used, the capacitance $C_2$ in air cannot be known accurately, and moreover its effect is large as described above. However, in the case of FIG. 7 that the high permittivity film is used, the effects of the capacitance $C_3$, which cannot be known accurately, on the measurement of the voltage $V_{in}$ is small enough to be neglected, so that the error caused by the measurement can be remarkably lowered.

Further, in the case of not using the high permittivity film, the effects of the capacitance $C_2$ in air is large, so that the distance between the E-O probe 100 and the electrode 110 is needed to be held accurately, but in the case of using the high permittivity film, the effect of the capacitance $C_3$ is small, the distance between the E-O probe 10 and the electrode 13 is not needed to be held so accurately as the previous case.

Figure 8:
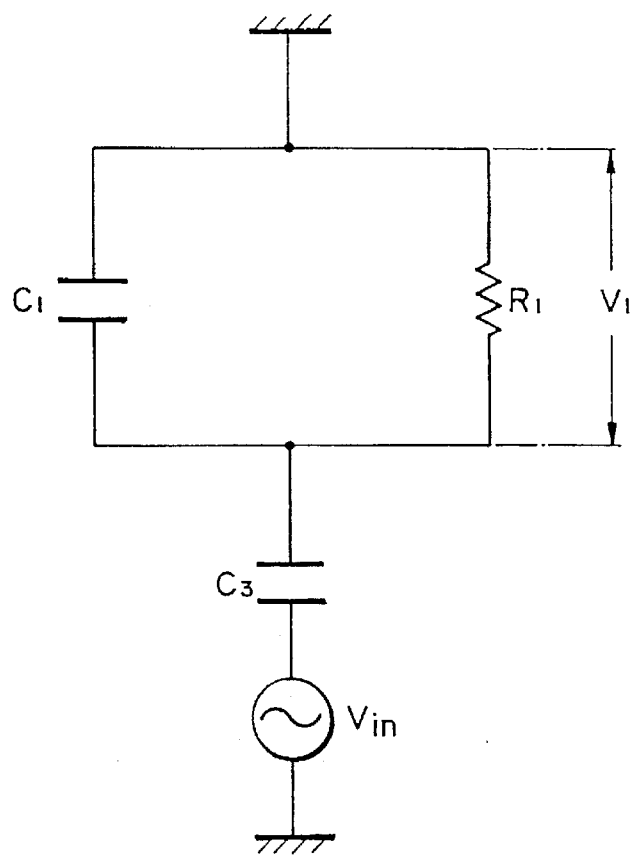

In the case of considering the resistance $R_1$ of the electro-optic material 11, the equivalent circuit of the E-O probe 10 is the one shown in FIG. 8. In the case of using ZnTe having the resistivity $\rho = 1 \times 10^5$ $\Omega$cm and the same size as described above as the electro-optic material 11, $R_1$ is given by $$R_1 = (1 \times 10^3) \times (10 \times 10^{-6})/(200 \times 10^{-6})^2$$
$$= 2.5 \times 10^5 \, \Omega.$$

$f_T$ at this point is given by $$f_T = 1/(2\pi(3.68 \times 10^{-13} + 1.77 \times 10^{-10}) \times 2.5 \times 10^5)$$
$$= 3.59 \times 10^3 \, \text{Hz}.$$

Thus, according to the E-O probe 10 of the present embodiment, signals at low frequency, which could not be detected conventionally, can be detected, and the detecting sensitivity in the low frequency region is improved.

Further, in the case that the electric field strength of the electrode 110 was detected with the conventional E-O probe 100, if the reflecting film 102 of the E-O probe 100 directly came in contact with the electrode 110, the reflecting film 102 might come in contact with other adjacent electrodes. Thus, there was a danger that the excess current flowed between the electrodes and destroyed the devices, if the plural electrodes came in contact.

However, if the E-O probe 10 of the present invention is used, since the insulating high permittivity film 14 covers the conductive reflecting film 12, such a danger can be solved.

Figure 9:
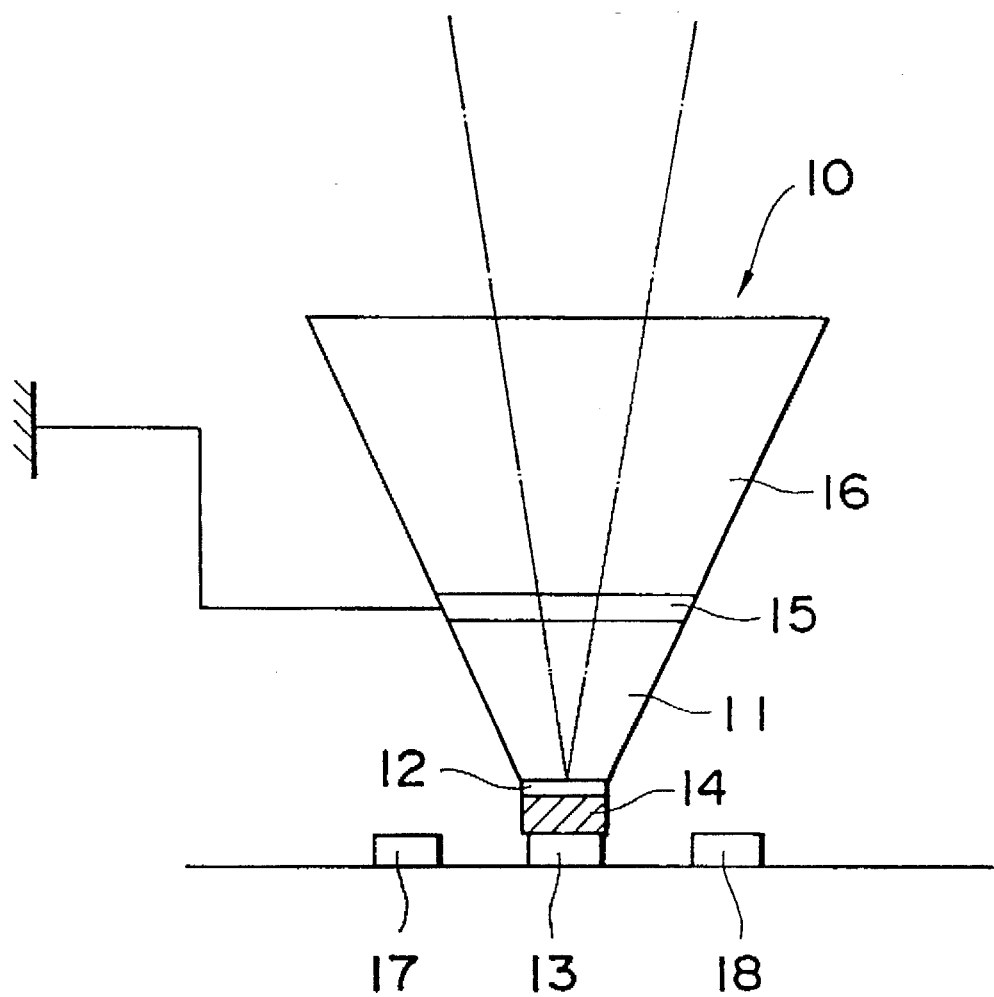
FIG. 9 is a cross sectional view showing structure of an E-O probe 10 according to the second embodiment of the present invention.

Next, referring to the cross sectional view of FIG. 9, the second embodiment of the present invention will be described. The second embodiment illustrates the where a point of the E-O probe 10 has a small area. In a case that a plurality of electrodes 17 and 18 exists nearby the electrode to be measured 13, if the area of the metal reflecting film 12 is large, the metal reflecting film 12 covers the plurality of electrodes 13, 17 and 18, so that it is hard to measure these electrodes individually. In the present embodiment, the area of the point of the E-O probe 10 is less than or equal to the area of the electrode 13 to be measured.

Figure 10:
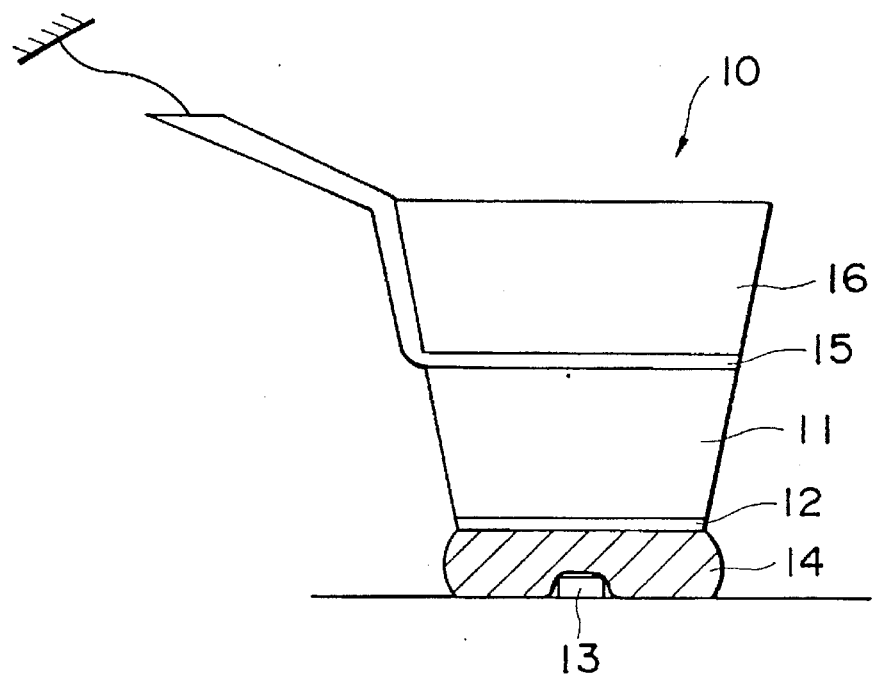
FIG. 10 and FIG. 11 are a cross sectional views showing structure of an E-O probe 10 according to the third embodiment of the present invention.

Next, referring to the cross sectional view of FIG. 10 and FIG. 11, the third embodiment of the present invention will be described. The third embodiment is a case of using resilient material which is elastic and able to deform. Even though the E-O probe 10 is strongly pressed to the electrode 13, since the high permittivity film 14 can be deformed, the damage of the electrode 13 and the film 14 can be reduced. Further, owing to the deformation of the high permittivity film 14, a space between the metal reflecting film 12 and the electrode 13 narrows, so that the detecting sensitivity of the electro-optic material 11 is improved.

Figure 11:
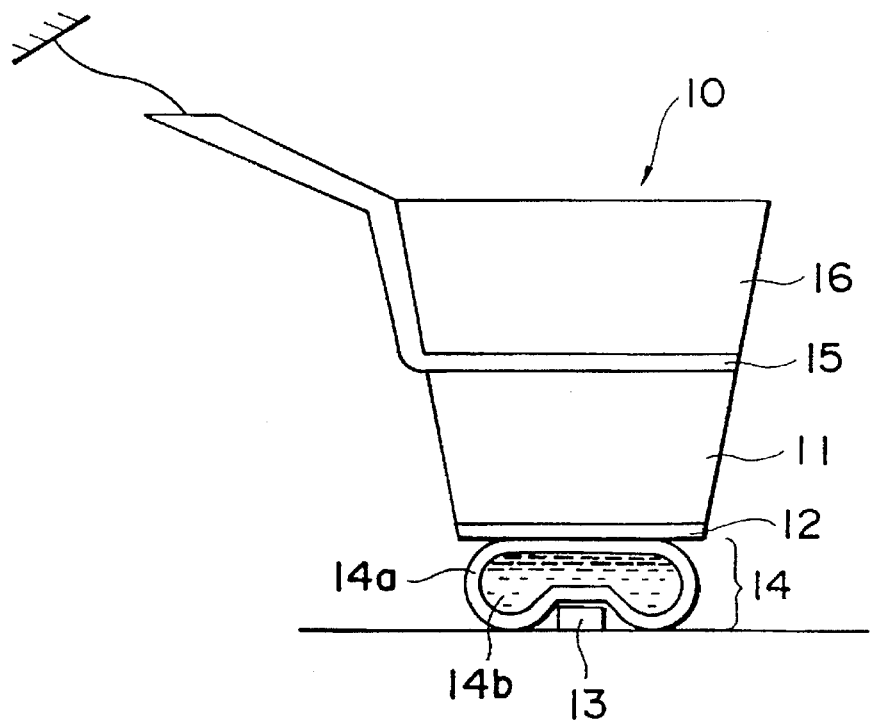

In the illustrative cases of using resilient material which can be deformed elastically, there are a case of using polymeric material (FIG. 10), and a case that solution 14$b$ having the high permittivity is sealed in a capsule 14$a$ made of resilient-film-like resin or an equivalent FIG. 11. The polymeric material is, for example, a natural rubber (the relative permittivity $\epsilon$=2.91), a synthetic rubber ($\epsilon$=6.5~8.1), an agar ($\epsilon$=80), and an gelatin ($\epsilon$=80). Further, solution 14$b$ having the high relative permittivity sealed in the capsule 14$a$ is, for example, pure water ($\epsilon$=80), ethanol ($\epsilon$=25), and glycerine ($\epsilon$=42.5).

According to the E-O probe 10 of the present invention, the insulating high permittivity film 14 is directly brought into contact with the electrode 13 to be measured, whereby the change of the voltage of the electrode 13 can be measured without letting the metal reflecting film 12 come in contact with the electrode 13. Further, by making the thickness of the high permittivity film 14 thin, the capacitance of the high permittivity film 14 increases and the relative capacitance of the electro-optic material 11 decreases. Therefore, the voltage applied to the electro-optic material 11 increases, so that the detecting sensitivity of the electro-optic material 11 to the voltage of the electrode 13 is improved.

Further, as the capacitance of the high permittivity film 14 increases, the cut-off frequency $f_T$ decreases, and then the frequency characteristics that is flat to the low frequency region can be obtained.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. An electrooptic probe for measuring voltage of an object, said probe comprising:
    an electro-optic material having a refractive index to light that varies in accordance with an electric field;
    a conductive reflecting film for reflecting an incident light beam transmitted through said electro-optic material, fixed to a first end face of said electro-optic material and being disposed to face said object, said reflecting film being made of metal;
    a transparent electrode fixed on a second end face of said electro-optic material; and
    a high permittivity film fixed on an end face of said reflecting film and being disposed to face said object, said high permittivity film having a constant thickness.

2. An electrooptic probe according to claim 1, wherein said electro-optic material comprises LiTaO$_3$.

3. An electrooptic probe according to claim 1, wherein said electro-optic material comprises GaAs.

4. An electrooptic probe according to claim 1, wherein said electro-optic material comprises ZnTe.

5. An electrooptic probe according to claim 1, wherein said electro-optic material comprises BSO.

6. An electrooptic probe according to claim 1, wherein said electro-optic material comprises CdTe.

7. An electrooptic probe according to claim 1, wherein said high permittivity film is an insulator.

8. An electrooptic probe according to claim 1, wherein said high relative permittivity film comprises resilient material.

9. An electrooptic probe according to claim 8, wherein said resilient material is a rubber.

10. An electrooptic probe according to claim 1, wherein said high permittivity film is easily deformed along with an external shape of said object to be measured when pressed to said object to be measured.

11. An electrooptic probe according to claim 10, wherein said high permittivity film comprises polymeric material.

12. An electrooptic probe according to claim 11, wherein said polymeric material is a natural rubber.

13. An electrooptic probe according to claim 11, wherein said polymeric material is a synthetic rubber.

14. An electrooptic probe according to claim 11, wherein said polymeric material is an agar.

15. An electrooptic probe according to claim 11, wherein said polymeric material is a gelatin.

16. An electrooptic probe according to claim 10, wherein said high permittivity film comprises a resilient capsule, and solution having the high permittivity sealed in said capsule.

17. An electrooptic probe according to claim 16, wherein said solution having the high permittivity sealed in said capsule is pure water.

18. An electrooptic probe according to claim 16, wherein said solution having the high permittivity sealed in said capsule is ethanol.

19. An electrooptic probe according to claim 16, wherein said solution having the high permittivity sealed in said capsule is glycerine.

20. An electrooptic probe according to claim 1, wherein said reflecting film comprises aluminum.

21. An electrooptic probe according to claim 1, wherein said reflecting film comprises silver.

22. An electrooptic probe according to claim 1, wherein said reflecting film comprises gold.

23. An electrooptic probe according to claim 1, wherein said reflecting film comprises cooper.

24. An electrooptic probe according to claim 1, wherein the size of said reflecting film is less than or equal to the size of said object to be measured.

25. An electrooptic probe according to claim 1, wherein a transparent support is fixed to said transparent electrode.

26. An electrooptic probe according to claim 1, wherein said incident light beam is a continuous laser beam.

27. An electrooptic probe according to claim 1, wherein said incident light beam is a pulsed laser beam.

28. An electrooptic probe according to claim 1, wherein said high permittivity film comprises $TiO_2$.

29. An electrooptic probe for measuring voltage of an object comprising:

an electro-optic material having a refractive index that varies in accordance with an electric field;

a conductive reflecting film for reflecting an incident light beam transmitted through said electro-optic material and being fixed to a first end face of said electro-optic material and facing said object;

a transparent electrode fixed on a second face of said electro-optic material; and a high permittivity film covering an entire end face of said reflecting film without covering side faces of said reflecting film, said high permittivity film being disposed so as to face said object, said side faces being continuous with said end face of said reflecting film, and said high permittivity film having an area equal to that of said end face of said reflecting film.

30. An electrooptic probe comprising:

an electro-optic material;

a reflecting film disposed on a first end surface of said electro-optic material;

a transparent electrode disposed on a second end surface of said electro-optic material;

a high-permittivity film disposed on a second end surface of said reflecting film, said high-permittivity film having a capacitance such that condition (1) produces a value of $f_T$ that is illustrative of increased sensitivity in a low frequency range around $3.59 \times 10^3$ Hz:

$$f_T = \frac{1}{(2\pi(C_1 + C_3)R_1)} \quad (1)$$

where $C_1$ and $R_1$ are capacitance and resistance of said electro-optic material, respectively, and $C_3$ is capacitance of said high-permittivity film.

* * * * *